United States Patent [19]

Visser et al.

[11] Patent Number: 5,270,543
[45] Date of Patent: Dec. 14, 1993

[54] ELECTRONIC PROBE AND METHOD FOR ITS MANUFACTURE

[75] Inventors: Eric P. Visser, Nijmegen; Wilhelmus J. P. Van Enckevort, Blerik-Venlo; Jan Doting, Nijmegen, all of Netherlands

[73] Assignee: Drukker International B.V., Sh Cuijk, Netherlands

[21] Appl. No.: 907,486

[22] Filed: Jul. 1, 1992

[30] Foreign Application Priority Data

Jul. 5, 1991 [NL] Netherlands .......................... 9101169

[51] Int. Cl.⁵ ............................................. H01J 37/26
[52] U.S. Cl. .................................................. 250/306
[58] Field of Search ...................... 250/306; 324/158 P

[56] References Cited

U.S. PATENT DOCUMENTS 4,943,720 7/1990 Jones ................................... 250/306
5,010,249 4/1991 Nishikawa .......................... 250/306

FOREIGN PATENT DOCUMENTS 0354020 2/1990 European Pat. Off. .
1-267401 10/1989 Japan ................................. 250/306

*Primary Examiner*—Jack I. Berman
*Attorney, Agent, or Firm*—Kane, Dalsimer, Sullivan, Kurucz, Levy, Eisele and Richard

[57] ABSTRACT

The present invention relates to an electronic probe. According to the invention this comprises a diamond substrate which is provided with an electrically conductive monocrystalline diamond layer, deposited via vapour deposition, which is ground to a tip of the probe. The invention entails further a method for the manufacture of such an electronic probe.

8 Claims, 3 Drawing Sheets

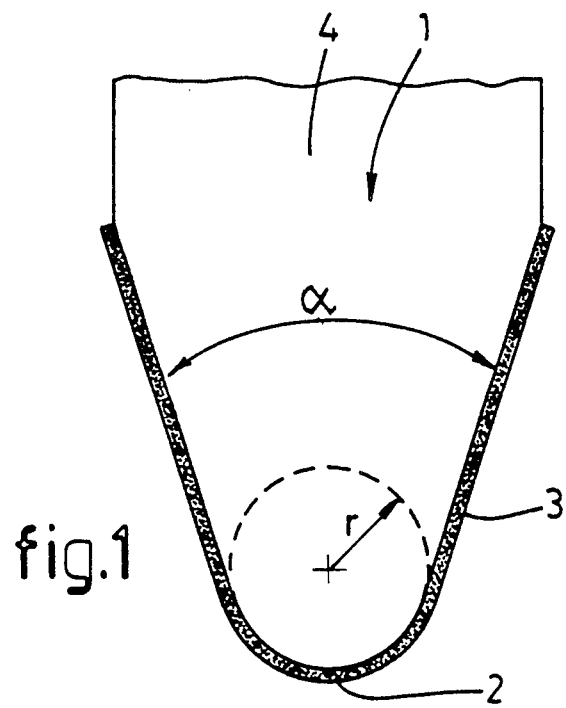
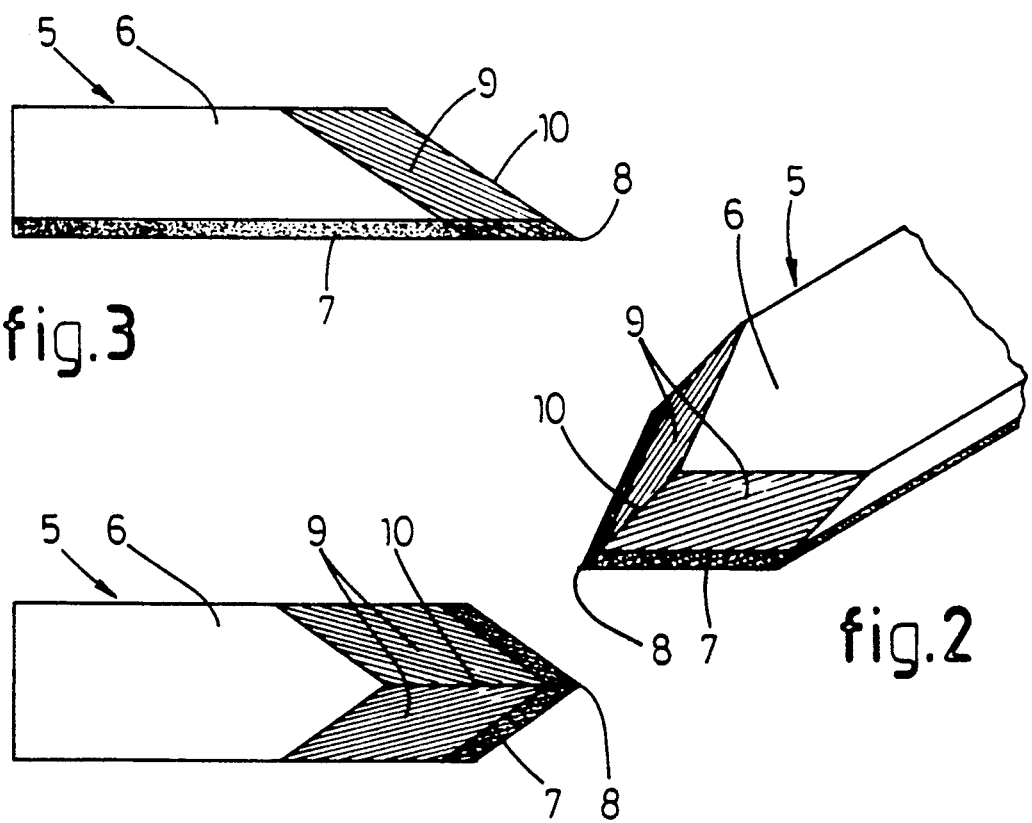

ELECTRONIC PROBE AND METHOD FOR ITS MANUFACTURE

The present invention relates to an electronic probe as well as a method for its manufacture.

Such a probe is known from the U.S. Pat. No. 4,943,720.

The known probe comprises an electrically conductive elongated base with conically tapering tip, as well as a thin, semi-conducting layer of diamond covering the tip. In general the diamond tip has a radius of less than 300 nm. Such probes are used in the so-called STM (Scanning Tunneling Microscopy) technique, allowing the surface of a conductive material to be scanned with the aid of a thin probe. In some cases this technique is so sensitive as to allow visualization of individual atoms at the surface of the substrate.

The end of the tip (probe) has to meet a number of requirements concerning in particular the apical angle and the radius. The apical angle should be as sharp as possible while the radius of this apical angle should be minimal. Another prerequisite is that the tip is electrically conductive, it must not contain any adsorbed impurities, and obviously, it must be as strong as possible.

In addition it is especially important that the entire geometry of the tip is precisely defined (epical angle and curve are known) and moreover, that it does not undergo any changes during operation (that is to say no deformation or breaking, no oxidation or other attack on the tip).

Although the durability etc. of the known probe with a diamond tip is much improved with respect to the originally applied STM tips, which were mostly made from tungsten or platinum/iridium, a number of disadvantages still adhere to the known tips.

In the first place the contact point of the known probe is not sufficiently fine. The reason for this is that the tip that is formed beforehand out of the substrate itself is already not sufficiently fine, while the final fineness will further decrease after application of the diamond material. The known tip is provided with a thin diamond layer which is applied by the chemical vapour deposition (CVD) method. The deposited diamond material is made semi-conductive by the addition of boron. The tip in the U.S. patent specification is produced by growing diamond onto a pointed object of conductive material such as, for instance, steel and silicon.

Because the substrate is steel or silicon, the diamond grows polycrystalline via the CVD method, this being generally known from the literature.

This polycrystalline growth has a number of important consequences, which are; The exact form of a tip at the most outer edge is not known and cannot be determined beforehand. After all, this form is determined by the chance size and orientation of the tiny crystal which is situated at precisely the extreme tip. This small crystal may point downward with a blunt point or with a certain crystallographic plane.

Although the U.S. patent specification mentions the possibility of afterward polishing the conductive diamond layer, it is generally known that this is hardly possible due to the polycrystalline character of the deposited diamond layer.

Another disadvantage of the known tip is that it is thermally less stable, this may cause a thermal drift which is a major factor of interference during STM measurements.

The aim of the present invention is to provide an electronic probe whereby the above-mentioned disadvantages have been effectively eliminated.

With this in view the electronic probe according to the invention is characterized in that it comprises a diamond substrate which is provided with an electrically conductive monocrystalline diamond layer deposited via vapour deposition, being ground to a tip of the probe.

The tip of the present probe is obtained by grinding or polishing, with the result that the tip geometry is determined accurately.

The deposition of diamond on diamond makes for very strong bonding, having a positive effect on the durability of the probe.

An advantageous aspect of the present probe is that if the tip should be damaged, it can be repaired by grinding.

Moreover, a diamond tip with a diamond base is thermally much more stable than the known tip with a steel or silicon base. Of nearly all the materials diamond has the lowest coefficient of expansion, therefore there is practically no occurrence of a disturbing thermal drift which is usually a major factor of interference during STM measurements.

As a rule the diamond substrate is not electrically conductive but in some cases it is possible to apply a somewhat electrically conductive IIb type diamond substrate. The IIb type diamond does, however, rarely occur in nature. Moreover, synthetic IIb type diamond is at present not commercially available.

In general the probe has an apical angle of 5°-60° at a radius of 10-100 nm.

The vapour deposition is preferably a chemical vapour deposition although the possibility exists to deposit the diamond layer via a physical process.

Furthermore, the invention entails a method for the manufacture of an electronic probe, characterized in that onto a diamond substrate an electrically conductive monocrystalline diamond layer is deposited via the vapour deposition method, after which the thus obtained diamond substrate provided with a diamond layer, is ground or polished to a point, in such a manner, that said point is formed by the deposited diamond.

The present procedure is an elegant method for obtaining an electrical probe of especially high quality.

Preferably the deposition takes place via the chemical vapour deposition method, which is in itself a known technique for growing diamond on a substrate.

One usually starts from an electrically non-conductive diamond substrate. However, one can also use a somewhat electrically conductive IIb type diamond substrate.

The diamond substrate being used according to the present method is a small diamond plate of, for instance, a length of about 3 mm, a width of about 1 mm and a thickness of about ½ mm. The thickness of the deposited diamond layer is 1-20 μ. On one side of the substrate the electrically conductive monocrystalline diamond layer is deposited. The thus obtained structure is then ground to a point.

The invention will be further explained in the light of the accompanying drawing, without this limiting the invention.

BRIEF DESCRIPTION OF THE DRAWINGS

FIG. 1 shows an electronic probe according to the prior art.

FIG. 2 is a perspective view of a preferred embodiment of the electronic probe according to the invention.

FIG. 3 is a side view of the electronic probe according to the invention as illustrated in FIG. 2.

FIG. 4 is a view from above of the electronic probe according to FIG. 2.

Figure 5:
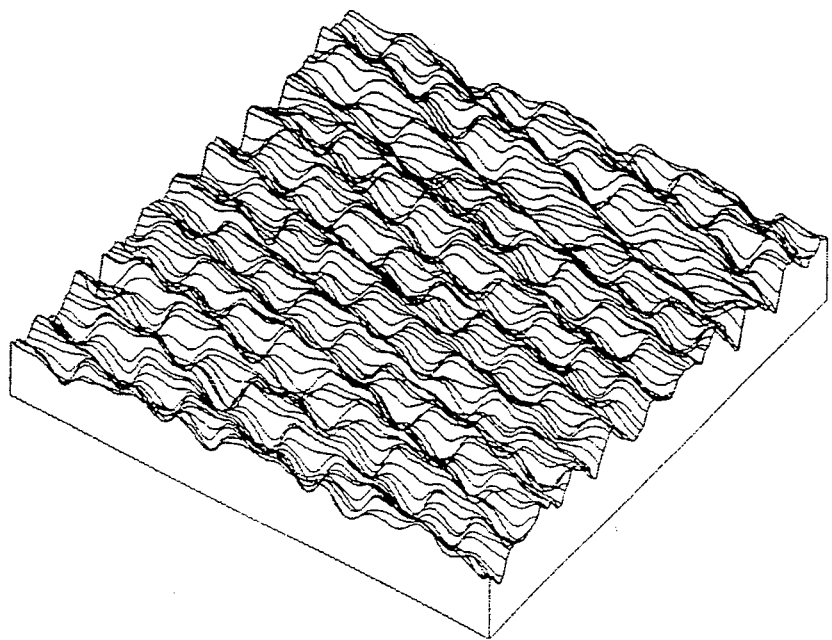
FIG. 5 shows individual carbon atoms at a graphite surface.

The electronic probe according to FIG. 1 is a probe according to the standard technique as described in the U.S. Pat. No. 4,943,720. This known probe 1 is provided with an electrically conductive substrate 4, which substrate is made from steel or another electrically conductive material. The tip-shaped extremity of the substrate is provided with a diamond layer 3, which ends in the tip 2. The radius r of the tip is less than 300 nm, while the value of the apical angle $a$ is not given.

The disadvantages of the known probe have already previously been mentioned in the preamble of the specification.

FIGS. 2-4 show the preferred embodiment of the electronic probe 5 according to the invention. This probe 5 comprises a diamond substrate 6 which is provided with a monocrystalline diamond layer 7, deposited via chemical vapour deposition, which is ground to a tip 8 of the probe. The grinding faces, along which the structure of the diamond substrate 6 and the electrically conductive monocrystalline diamond layer 7 are ground, are indicated in FIGS. 2-4 by the reference number 9. In addition, the junction line of the planes 9 is indicated in the figures by the reference number 10.

The probe illustrated in FIGS. 2-4 is about 3 Mm long with a width of about 1 mm and a thickness of about ½ mm. The deposited diamond layer is about 5 μ.

The diamond substrate 6 according to the preferred embodiment of this invention is a non-conductive diamond substrate. In some cases a somewhat electrically conductive IIb type diamond substrate may be used as diamond substrate.

The electronic probe according to the invention generally has an apical angle of 5°-60° and a radius of 10-100 nm; in FIG. 3 the apical angle is about 40°.

The results illustrated in FIGS. 5-8 can be obtained with the aid of the electronic probe according to the invention.

In FIG. 5 the individual carbon atoms at a graphite surface have been visualized very well, with the aid of the electronic probe according to the invention.

Figure 6:
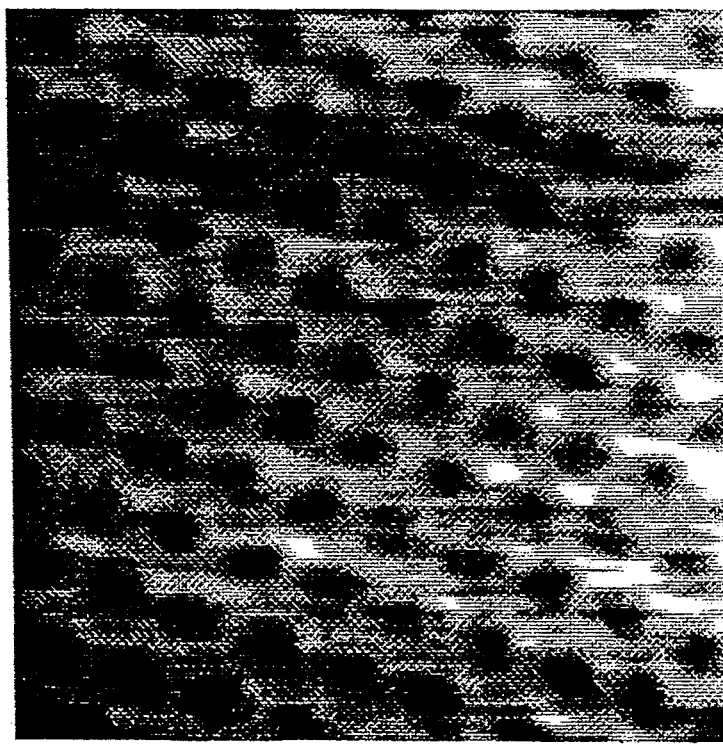
FIG. 6 shows individual carbon atoms at a graphite surface in conformity with FIG. 5, the grey tints showing the differences in height.

FIG. 6 shows a graphite surface according to FIG. 5, whereby the grey tints illustrate the differences in height.

Figure 7:
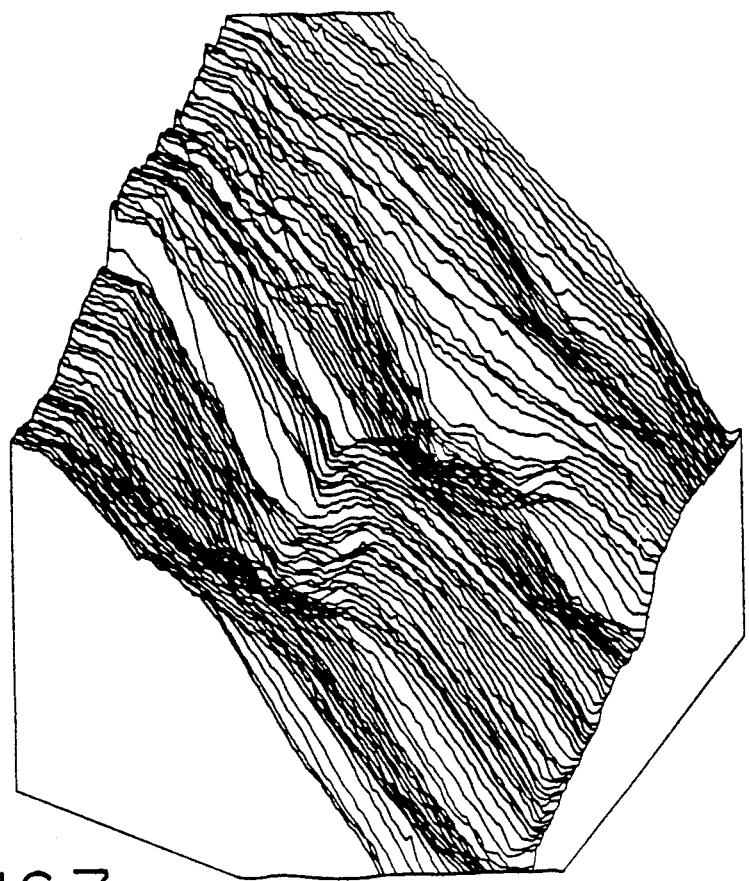
FIG. 7 shows the structure of a tilted gold surface.

FIG. 7 illustrates an example of a structure of a tilted gold surface, which structure has been visualized with the aid of an electronic probe according to the invention.

Figure 8:
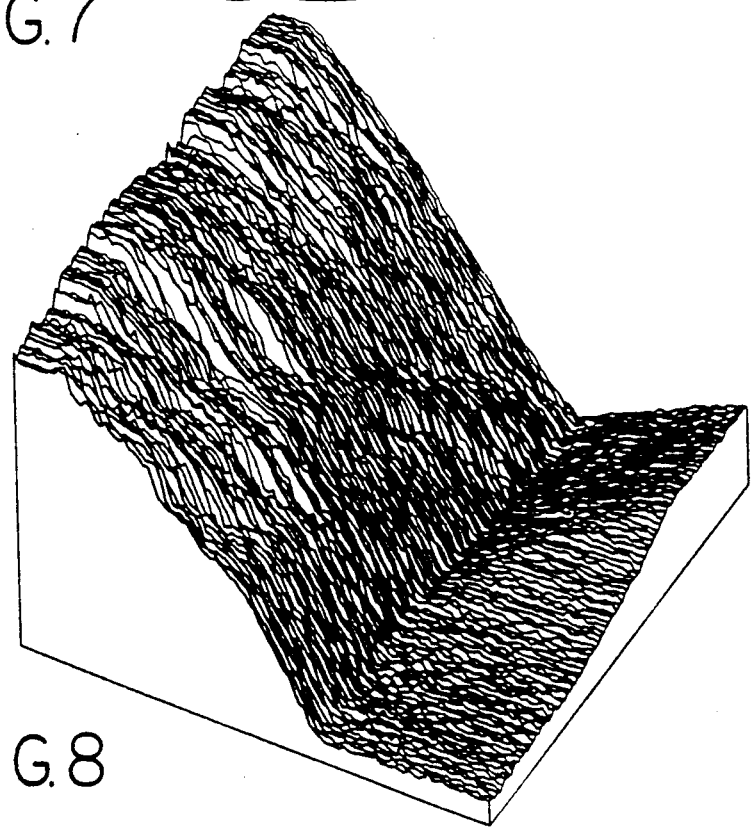
FIG. 8 shows the same surface as FIG. 7 into which a small channel was engraved using the diamond tip according to the invention.

Finally, FIG. 8 shows an example of the same surface as in FIG. 7, where a small channel has been engraved into it with the aid of the electronic probe according to the invention.

It should be remarked, that the electronic probe according to the invention is also suitable for treating metal surfaces on a nanometer scale.

It should be mentioned, that the present invention is in no way limited to the forms of execution described above.

We claim:

1. An electronic probe, characterized in that it comprises a diamond substrate which is provided with an electrically conductive monocrystalline diamond layer, deposited via vapour deposition, which is ground to a tip of the probe.

2. An electronic probe according to claim 1, characterized in that the diamond substrate is of the somewhat electrically conductive IIb type.

3. An electronic probe according to claim 1, characterized in that the probe has an apical angle of 5°-60° and a radius of 10-100 nm.

4. An electronic probe according to claim 1, characterized in that the vapour deposition is a chemical vapour deposition.

5. A method for the manufacture of an electronic probe according to claim 1, characterized in that onto a diamond substrate an electrically conductive monocrystalline diamond layer is deposited via the vapour deposition method, after which the thus obtained diamond substrate provided with a diamond layer, is ground or polished to a tip, in such a manner, that said tip is formed by the deposited diamond.

6. A method according to claim 5, characterized in that deposition takes place via the chemical vapour deposition method.

7. A method according to claim 5, characterized in that as diamond substrate a somewhat electrically conductive IIb type diamond substrate is used.

8. A method according to claim 5, characterized in that as diamond substrate a small diamond plate us used onto one side of which the diamond layer is deposited.

* * * * *